(12) United States Patent
Woo et al.

(10) Patent No.: US 9,357,117 B2
(45) Date of Patent: May 31, 2016

(54) PHOTOGRAPHING DEVICE FOR PRODUCING COMPOSITE IMAGE AND METHOD USING THE SAME

(71) Applicant: SAMSUNG ELECTRONICS CO., LTD., Suwon-si (KR)

(72) Inventors: Ji-Hwan Woo, Seoul (KR); Se-Hoon Kim, Suwon-si (KR); Tae-gyu Lim, Seoul (KR); Han-tak Kwak, Suwon-si (KR); Woo-sung Shim, Suwon-si (KR); Seo-young Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/134,005

(22) Filed: Dec. 19, 2013

(65) Prior Publication Data

US 2014/0184841 A1    Jul. 3, 2014

(30) Foreign Application Priority Data

Dec. 28, 2012    (KR) .......................... 10-2012-0157065

(51) Int. Cl.
*H04N 5/225*    (2006.01)
*H04M 1/02*    (2006.01)
*H01L 27/146*    (2006.01)
*H04N 5/232*    (2006.01)
*H04N 5/272*    (2006.01)

(52) U.S. Cl.
CPC ........ *H04N 5/2257* (2013.01); *H01L 27/14618* (2013.01); *H04M 1/0264* (2013.01); *H04N 5/2254* (2013.01); *H04N 5/23232* (2013.01); *H04N 5/23293* (2013.01); *H04N 5/272* (2013.01)

(58) Field of Classification Search
CPC .......... H04N 2005/2726; H04N 5/262–5/2723
See application file for complete search history.

(56) References Cited

U.S. PATENT DOCUMENTS

| 8,254,760 | B2 | 8/2012 | Neuman et al. |
| 2003/0103074 | A1 | 6/2003 | Jasinschi |
| 2005/0036044 | A1* | 2/2005 | Funakura ...................... 348/239 |
| 2006/0187321 | A1* | 8/2006 | Sakamoto ...................... 348/239 |
| 2008/0317378 | A1* | 12/2008 | Steinberg et al. ............. 382/275 |
| 2009/0238419 | A1* | 9/2009 | Steinberg et al. .......... 348/222.1 |
| 2009/0244296 | A1 | 10/2009 | Petrescu et al. |

(Continued)

FOREIGN PATENT DOCUMENTS

| GB | 2398696 A | 8/2004 |
| JP | 2005-204015 A | 7/2005 |

(Continued)

OTHER PUBLICATIONS

Communication dated Mar. 25, 2014, from the European Patent Office in counterpart European Application No. 13199825.4.

*Primary Examiner* — Jason Flohre
(74) *Attorney, Agent, or Firm* — Sughrue Mion, PLLC

(57) ABSTRACT

A photographing device includes a photographing unit, an image processor which separates an object from a first photographing image obtained by the photographing unit, a display which displays a background live view obtained by superimposing the separated object on a live view of a background, and a controller which obtains a second photographing image corresponding to the live view of the background when a command to shoot the background is input and generates a composite image based on the separated object and the second photographing image.

22 Claims, 12 Drawing Sheets

(56) References Cited

U.S. PATENT DOCUMENTS

| | | | |
|---|---|---|---|
| 2011/0053654 A1* | 3/2011 | Petrescu et al. | 348/333.11 |
| 2011/0249074 A1 | 10/2011 | Cranfill et al. | |
| 2012/0057309 A1 | 3/2012 | Yu et al. | |
| 2012/0092529 A1* | 4/2012 | Choi et al. | 348/239 |
| 2012/0268552 A1 | 10/2012 | Choi et al. | |

FOREIGN PATENT DOCUMENTS

| | | |
|---|---|---|
| JP | 2012-182582 A | 9/2012 |
| KR | 10-2011-0060499 A | 6/2011 |
| KR | 10-2012-0118583 A | 10/2012 |

\* cited by examiner

PHOTOGRAPHING DEVICE FOR PRODUCING COMPOSITE IMAGE AND METHOD USING THE SAME

CROSS-REFERENCE TO RELATED APPLICATION

This application claims priority from Korean Patent Application No. 10-2012-0157065, filed on Dec. 28, 2012, in the Korean Intellectual Property Office, the disclosure of which is incorporated herein by reference in its entirety.

BACKGROUND

1. Field

Apparatuses and methods consistent with the exemplary embodiments relate to a photographing device and a method for producing a composite image, and more particularly, to a photographing device capable of producing a composite image based on an object separated from a photographed image and a live view of a background, and a method for producing a composite image using the same.

2. Description of the Related Art

Due to development of electronic technology, various portable devices have been developed and distributed. Recent portable devices are provided with a display means and a photographing means, thereby supporting a photographing function. A photographing device supporting the photographing function displays a live view on a display means using light coming through a lens. Thus, a user may capture pictures while viewing the live view.

As photographing becomes common, photographs may be captured in various locations and the captured photographs may be used in various ways. For example, users may upload the captured pictures to their blogs, Internet forums, or social network services (SNSs) and share the captured pictures with others.

Meanwhile, the user may wish to capture pictures of himself or herself in famous places or buildings. In this case, when there is no one to assist to photograph the picture of the user, the user needs to photograph the picture by using a self shooting mode or a timer.

In order to use the timer, however, the user needs to put the photographing device on the ground or floor, adjust a shooting angle or direction, and fix the photographing device to a certain position. In addition, when taking a picture of the user in the self shooting mode, the picture may be mostly filled with the user's face due to a limit of the user's arm's length. Thus, it is difficult to recognize a background of the picture.

Accordingly, there is a need for a technology for photographing a picture of the user and the background in the self shooting mode while maintaining a good ratio therebetween.

SUMMARY

Exemplary embodiments of the present disclosure overcome the above disadvantages and other disadvantages not described above. Also, the present disclosure is not required to overcome the disadvantages described above, and an exemplary embodiment of the present disclosure may not overcome any of the problems described above.

An aspect of exemplary embodiments relates to a photographing device capable of producing a composite image by separating an object from a captured image and superimposing the separated object on a live view, and a method for producing a composite image using the same.

According to an exemplary embodiment, a photographing device includes a photographing unit, an image processor which separates an object from a first photographing image obtained by the photographing unit, a display which displays a background live view obtained by superimposing the separated object on a live view of a background, and a controller which obtains a second photographing image corresponding to the live view of the background when a command to shoot the background is input and generates a composite image based on the separated object and the second photographing image.

When a composite shooting mode is selected, the controller may control the display to display a live view of the object and search for and track the object by monitoring respective frames of the live view of the object, and when a command to shoot the object is input, the controller may generate the first photographing image corresponding to the live view of the object and control the image processor to separate the tracked object from the first photographing image.

The photographing unit may include a first photographing unit which captures a photograph in a first shooting direction, and a second photographing unit which captures a photograph in a second shooting direction opposite to the first shooting direction.

When the composite shooting mode is entered, the controller may activate the first photographing unit to provide the live view of the object to the display, and when the first photographing image is obtained by the first photographing unit, the controller may activate the second photographing unit to provide the live view of the background, on which the separated object is superimposed and provided to the display.

The photographing device may further include a storage unit which stores a previously learned object model, the object model being obtained based on a plurality of images of the object to determine an object area in which the object is located, wherein the controller determines that the object is located in the object area determined by the object model on the first photographing image.

The display may display the first photographing image, and when a user's manipulation for the first photographing image is performed, the controller may change at least one of a size and a shape of the object area according to the user's manipulation.

The controller may control the image processor to restore a shape of the object separated from the first photographing image, and superimpose and display the object having the restored shape on the live view of the background.

The controller may control the image processor to adjust at least one of a display position, a size, a color and a brightness of the object on the background live view according to a user's selection.

The controller may adjust at least one of a display position, a size, a color and a brightness of the separated object based on the live view of the background.

According to another exemplary embodiment, a method for producing a composite image includes obtaining a first photographing image and separating an object from the first photographing image, displaying a background live view obtained by superimposing the object on a live view of a background, obtaining a second photographing image corresponding to the live view of the background when a command to shoot a background is input, and generating a composite image based on the separated object and the second photographing image.

The separating the object may include, when a composite shooting mode is selected, displaying a live view of the object, searching for and tracking the object by monitoring respective frames of the live view of the object, and when a command to shoot the object is input, generating the first photographing image corresponding to the live view of the object, and separating the tracked object from the first photographing image.

The searching for and tracking the object may include obtaining an object model based on a plurality of images of the object to determine an object area in which the object is located and determining that the object is located in the object area determined by the object model on the first photographing image.

The separating the object may include displaying the first photographing image, and when a user's manipulation for the first photographing image is performed, changing at least one of a size and a shape of the object area according to the user's manipulation.

The method may further include restoring a shape of the object separated from the first photographing image.

The method may further include adjusting at least one of a display position, a size, a color and a brightness of the separated object on the background live view according to a user's selection.

The method may further include adjusting at least one of a display position, a size, a color and a brightness of the separated object based on the live view of the background.

According to an exemplary embodiment, an image processing apparatus includes a first image input unit which receives a first image including an object; a second image input unit which receives a second image different from the first image; an object processing unit which separates the object from the first image; and an image composing unit which superimposes the separated object on the second image to be provided as a preview image to a user and generates a composite image based on the separated object and the second image when the preview image is selected by the user.

The first image and the second image may be received simultaneously.

The first image and the second image may be received in a subsequent order.

The object processing unit may restore a shape of the object separated from the first image and the image composing unit may generate the composite image based on the object having the restored shape and the second image.

The object processing unit may adjust at least one of a display position, a size, a color and a brightness of the object on the preview image according to a user's selection.

The controller may adjust at least one of a display position, a size, a color and a brightness of the separated object based on the second image.

According to an exemplary embodiment, a non-transitory computer readable recording medium having recorded thereon a program executable by a computer for performing the above method is provided.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION

Figure 1:
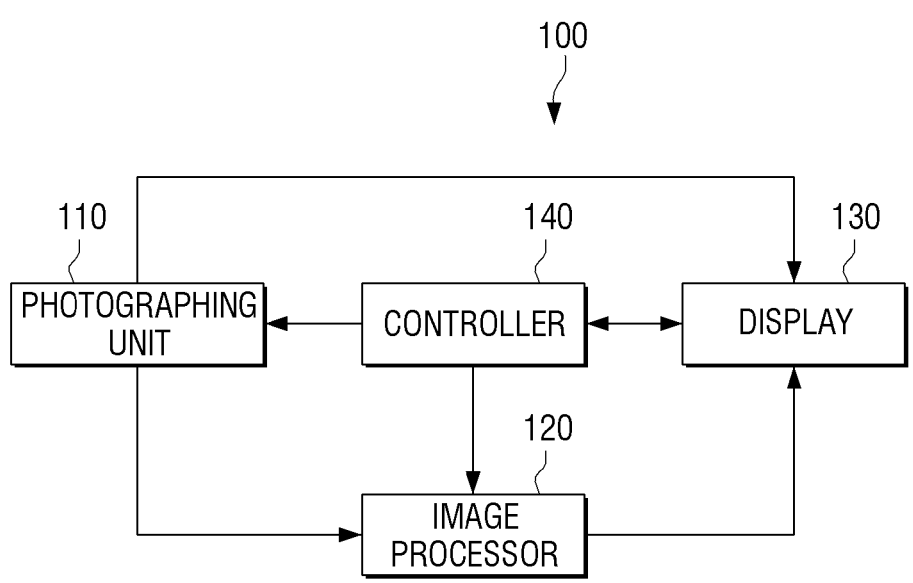
FIG. 1 is a block diagram illustrating a configuration of a photographing apparatus according to an exemplary embodiment of the present disclosure.

Certain exemplary embodiments of the present disclosure will now be described in greater detail with reference to the accompanying drawings.

In the following description, like drawing reference numerals are used for like elements, even in different drawings. The matters defined in the description, such as detailed construction and elements, are provided to assist in a comprehensive understanding of the disclosure. However, it should be understood that the exemplary embodiments of the present disclosure can be carried out without those specifically defined matters. Also, well-known functions or constructions are not described in detail since they would obscure the disclosure with unnecessary detail.

FIG. 1 is a block diagram illustrating a configuration of a photographing apparatus according to an exemplary embodiment of the present disclosure. The photographing device 100 may be implemented in various types of devices, such as a digital camera, a camcorder, a mobile phone, a tablet computer, a laptop computer, a personal digital assistant (PDA), an MP3 player, and the like.

As shown in FIG. 1, the photographing device 100 may include a photographing unit 110, an image processor 120, a display 130, and a controller 140.

The photographing unit 110 performs a shooting operation. The photographing unit 110 may include a lens and an image sensor. Types of lens used in the photographing unit 110 may be a general-use lens, a wide-angle lens, a zoom lens, and the like. The type of lens may be decided according to a type and a feature of the photographing device 100 and user environment. The image sensor may be a complementary metal oxide semiconductor (CMOS), a charge coupled device (CCD), or the like.

The image processor 120 processes an image sensed by the photographing unit 110. More specifically, the image processor 120 separates an object, which is a specific subject of the shooting operation, from an image obtained by the photographing unit 110.

Separation of the object may be performed using various algorithms.

In an exemplary embodiment, the controller 140 divides, for example, a photographed image captured by the photographing unit 110 or a live view image displayed on the display 130 in a unit of pixel or pixel block comprising a plurality of pixels. The controller 140 compares pixel values of respective pixels or representative pixel values of respective pixel blocks, and detects a pixel area of which pixel values or representative pixel values has a difference therebetween which is greater than a predetermined threshold value. The controller 140 determines that a detected pixel area is at an edge and determines an object area based on the determined edge.

The controller 140 determines that an object area satisfying a preset condition is a subject for compositing. The controller 140 controls the image processor 120 to separate the object area satisfying the preset condition from the photographed image. In an exemplary embodiment, when composing a person's face, the controller 140 may determine that an object area having pixel values corresponding to a facial color is a subject for compositing.

In another example, the controller 140 may determine the object area using a previously learned object model. The object model is a model which analyzes a plurality of images obtained by taking photographs of the object multiple times or analyzes a plurality of live view images of the object and defines the object area according to statistics of an area in which the object is located. The object model may be continuously updated by repeated learning. The controller 140 may apply the object model to the photographed image and determine that the object is located in an area corresponding to the object model. More specifically, the object area may be specified based on an edge defining the area corresponding to the object model. The controller 140 controls the image processor 120 to separate the object area which is determined by the object model.

The display 130 displays a live view obtained by the photographing unit 110. The live view is an image provided to identify a subject through the display 130, not a viewfinder. More specifically, light entering through the lens of the photographing unit 110 is introduced into the image sensor, and the image sensor outputs an electrical signal corresponding to the incident light to the display 130. Accordingly, an image of the subject to be photographed is displayed on a live view area. The live view may be provided in various ways such as a contrast auto focus (AF) live view method, a phase difference AF live view method, and a method of using a separate image sensor for processing the live view. When the image processor 120 separates the object, the separated object is superimposed onto the live view and is displayed, which will be described later.

The controller 140 controls an overall operation of the photographing device 100. More specifically, when a shooting command is input, the controller 140 controls the photographing unit 110 to capture a photograph. Accordingly, when an image corresponding to a background is photographed, the controller 140 generates a composite image by applying the object to the photographed image. The controller 140 controls the image processor 120 to perform various image processing on the object so that the photographed image composited with the object 11 may appear natural.

More specifically, the image processor 120 may perform a tone mapping to reduce a difference in brightness between the object 11 and a background image and to adjust color distribution. In addition, the image processor 120 may perform an image matting to remove a distinctive boundary between the object and the background image. As a result, more natural composite images may be generated.

The operation of generating the composite image as described above may be performed when the photographing device 100 operates in a composite shooting mode. That is, the photographing device 100 may operate in various shooting modes, such as a general shooting mode, a self shooting mode, the composite shooting mode, a special shooting mode, and the like, according to the user's selection.

Figure 2:
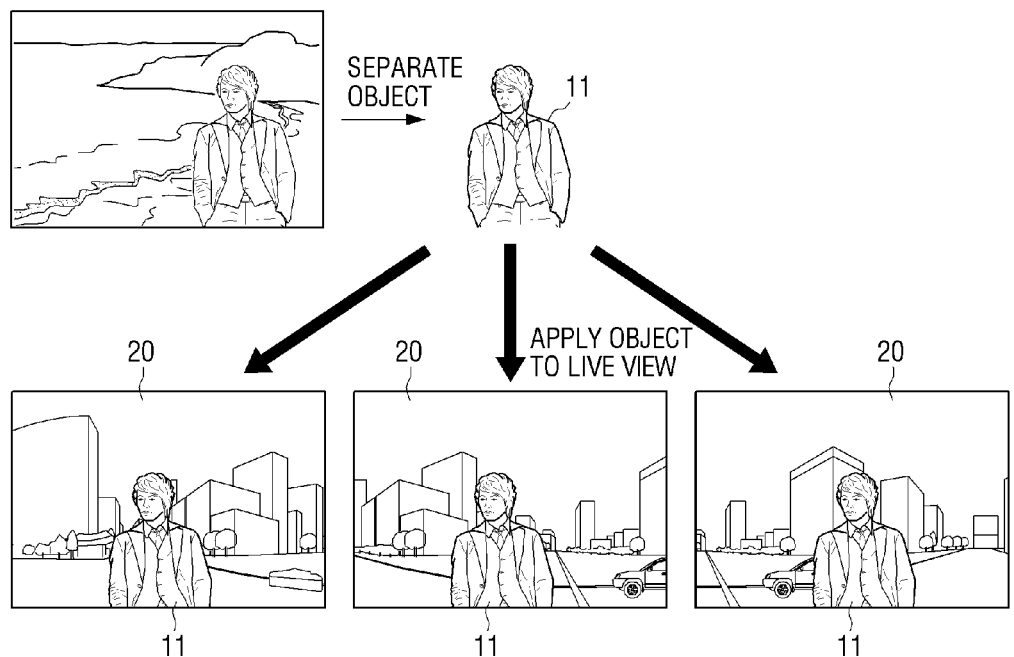
FIG. 2 illustrates a method for producing a composite image according to an exemplary embodiment of the present disclosure.

FIG. 2 illustrates a method for producing a composite image. With reference to FIG. 2, when the composite shooting mode is selected, the controller 140 activates the photographing unit 110 to display a live view. Here, when the shooting command is input, a photographing image 10 including an object 11 is obtained. The image processor 120 separates the object 11 from the photographing image 10.

When the photographing image 10 is obtained, the controller 140 activates the photographing unit 110 again to display a live view 20 on the display 150. The display 150 superimposes the object 11 on the live view 20 and displays the superimposed object 11 on the live view 20 on a screen. The live view 20 may change according to a shooting direction of the photographing device 100 in real time, but the same object 11 is displayed on the live view 20. Accordingly, while the user views the background image and the object 11 on the screen, the user may input the shooting command at a desired shooting angle and shooting time in consideration of composing the object 11 and the background image. When the shooting command is input, the controller 140 controls the photographing unit 110 to obtain a photographing image and composites the photographing image and the object 11 to become a single image. For illustrative purposes, the firstly photographed image is referred to as a first photographing image or an object image, and the subsequently photographed image is referred to as a second photographing image or the background image. In addition, the live view 20 displayed with the object 11, which is superimposed thereon, is referred to as a background live view.

Figure 3:
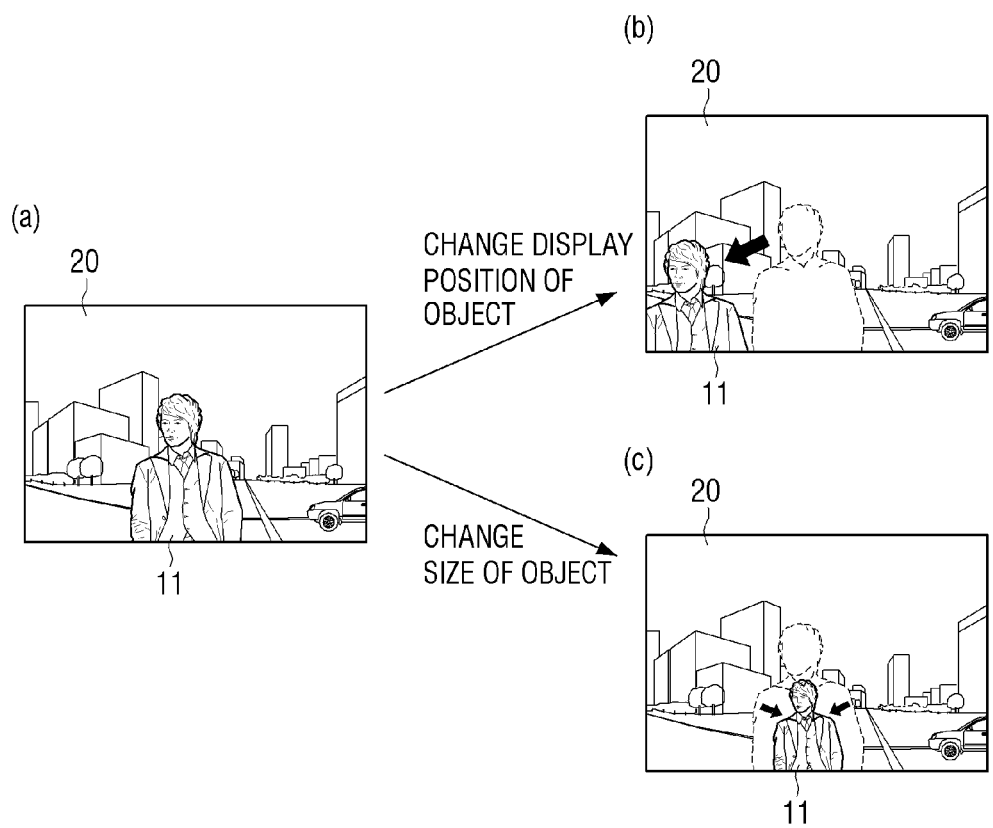
FIGS. 3 and 4 illustrate various methods for displaying an object on a live view.

FIG. 3 illustrates a composite method according to another exemplary embodiment of the present disclosure. With reference to FIG. 3, the photographing device 100 may change at least one of display properties such as a display position, a size, a color, and a brightness of the object on the background live view.

For example, when the object 11 is separated from the first photographing image, the object 11 is superimposed and displayed on the background live view 20 as shown in FIG. 3(A). Here, when the user touches the object 11 and drags the object 11 to another position, the controller 140 analyzes a coordinate value of a touched point and determines a trajectory and a direction of the dragging using values sensed by a touch sensor provided in the display 130. The controller 140 controls the image processor 120 to change a display position of the object 11 according to the trajectory and the direction of the dragging. Therefore, as shown in FIG. 3(B), the object 11 moves to another position on the background live view 20 and is displayed.

In addition, the user may perform a manipulation such as pinch-in and pinch-out. When two or more points in an area in which the object 11 is displayed are touched by, for example, fingers and a distance between the touched points increases by spreading the fingers apart, the controller 140 determines that a pinch-in manipulation to enlarge a size of the object 11 is performed. On the contrary, when the distance between the touched points decreases by bringing the fingers closer, the controller 140 determines that a pinch-out manipulation to reduce the size of the object 11 is performed. The controller 140 controls the image processor 120 to enlarge or reduce the size of the object 11 according to the determination result. FIG. 3(C) shows that the size of the object 11 is reduced.

In FIGS. 3(B) and 3(C), the display position and the size of the object change according to the user's manipulation. However, display properties of the object may be automatically adjusted according to a feature of the background live view. That is, the controller 140 may analyze the background live view 20 and control the image processor 120 to move the object 11 such that the object 11 and other objects in the background live view 20 do not overlap each other or to adjust the size of the object 11 such that the object 11 and other objects in the background live view 20 do not overlap each other.

In FIG. 3, an exemplary embodiment of changing the display position and the size of the object 11 is described. In an alternative embodiment, properties such as the brightness and the color of the object 11 may be adjusted based on the feature of the background live view.

Figure 4:
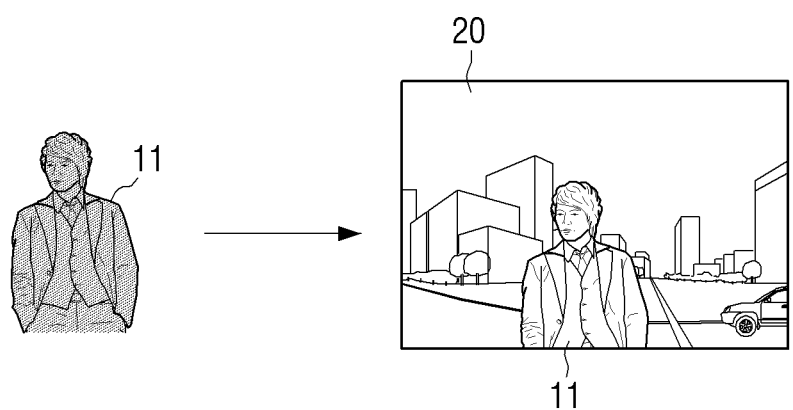

FIG. 4 illustrates an exemplary embodiment of adjusting the brightness of the separated object 11 to correspond to properties such as the brightness or color of the background live view 20. The controller 140 analyzes a property such as the brightness or color of the background live view 20 and controls the image processor 120 to adjust the brightness or color of the object 11 corresponding to the analyzed property of the background live view 20. FIG. 4 shows that the brightness of the object 11 increases according to that of the background live view 20.

In another exemplary embodiment of the present disclosure, the photographing device 100 may track and separate the object based on the live view.

Figure 5:
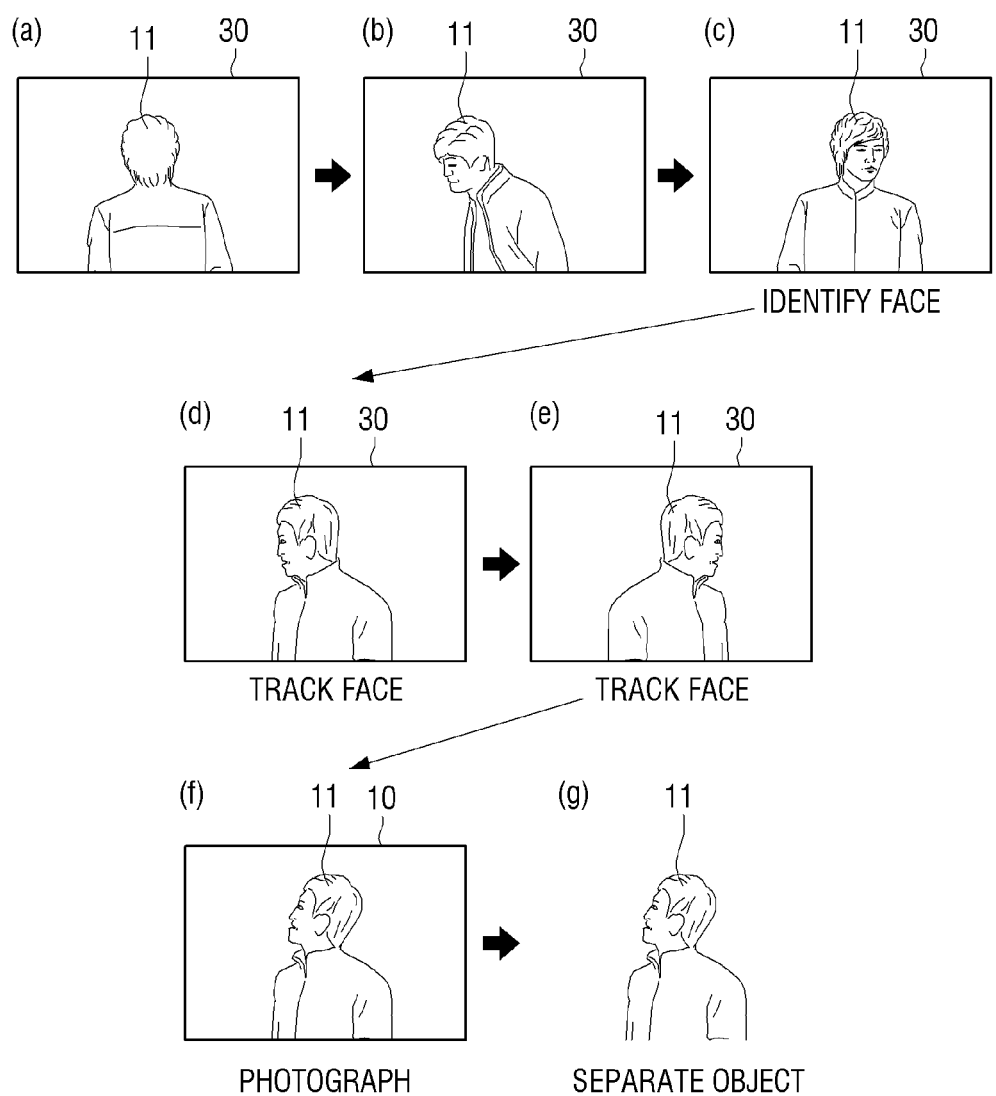
FIG. 5 illustrates a method for separating an object from a captured image.

FIG. 5 illustrates a method for separating an object from an image according to another exemplary embodiment of the present disclosure.

In the composite shooting mode, the controller 140 activates the photographing unit 110 to display a live view 30. The live view 30 displays the object 11, which is a subject to be photographed.

The controller 140 searches for the object 11 by monitoring respective frames of the live view 30. In an exemplary embodiment, the controller 140 may extract the live view 30 in a frame unit and analyze the extracted frames to detect an edge. The controller 140 determines that, among pixel areas defined by the edge, a pixel area including pixels which have similar pixel values and are adjacent to one another correspond to the object 11.

In this case, when a size of the determined pixel area is smaller than a threshold value, it may be difficult to determine the pixel area as the object 11. For example, when a back of the user's head is displayed as shown in FIG. 5(A), or when the user's face in a side profile is displayed as shown in FIG. 5(B), a pixel area corresponding to the user's face is relatively small and thus it may be difficult to determine a face area of the user. Accordingly, the controller 140 monitors the live view 30 continuously until the face area is determined.

When the user faces toward the photographing unit as shown in FIG. 5(C), the size of the face area may be greater than the threshold value. Thus, the face area and a body area which is connected thereto are determined to be the object 11. Once the object 11 is determined, the controller 140 may track the object 11 continuously even when the size of the object 11 decreases or the object 11 moves. Accordingly, when the user moves and change a position of the user's face as shown in FIGS. 5(D) and 5(E), the object 11 may still be correctly determined. Here, when shooting is performed, the photographing image 10 is obtained as shown in FIG. 5(F). Subsequently, the object 11 is separated from the photographing image 10.

As described above, when the user firstly captures a photograph of his or her own, auto segmentation to separate the image of the user from the captured image is performed. In FIG. 5, the object 11 is automatically separated, however, in order to increase precision of the auto segmentation, the user may additionally adjust an object area to be separated, which will be described below.

Figure 6:
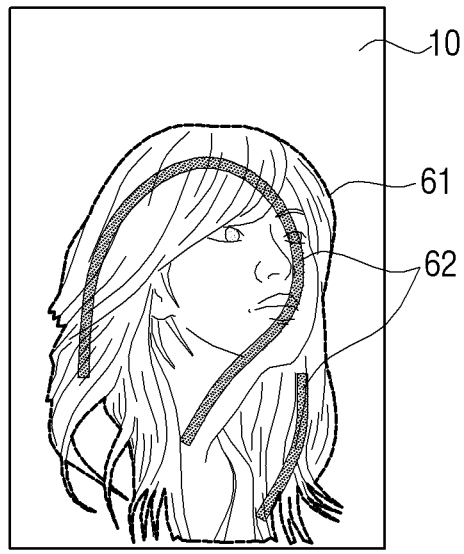
FIG. 6 illustrates a method for adjusting an object area according to a user's manipulation.

FIG. 6 illustrates a method for adjusting an object area in a photographing device according to another exemplary embodiment of the present disclosure. When a first photographing image 10 is obtained, the controller 140 displays the first photographing image 10 on a screen of the display 130. Here, a guide image 61 for expressing a boundary of the object may be shown together on the screen. The controller 140 performs the auto segmentation to automatically specify the object area, determines a boundary of the object area, and renders the guide image 61 in a dotted line or a solid line at the boundary.

Here, the user may perform various manipulations on the screen, such as a touch, a drag, a flick, a scribble, and a lug. In this case, a line image 62 may be displayed on the screen according to a trajectory of the user's manipulation. Consequently, a size and a shape of the object area, i.e., an area which is determined to be the object, may change according to a direction or an extent of the user's manipulation on the screen. Accordingly, the object may be precisely determined by adjusting the object area.

In addition, the composition of the photographing image may vary according to a distance from a subject to the photographing device and the size of the subject. For example, when the user captures a photograph of his or her own, the photographing image may not show the whole body of the user but show only his face and a part of his upper body due to a limit of the user's arm's length. In this case, when the object is separated, the other part of the user's upper body and lower body are not included in the object. As a result, when the object is composited with the background image, the composite image may look unnatural. Therefore, before composing the object with the background image, it may be desirable to restore a shape of the separated object.

Figure 7:
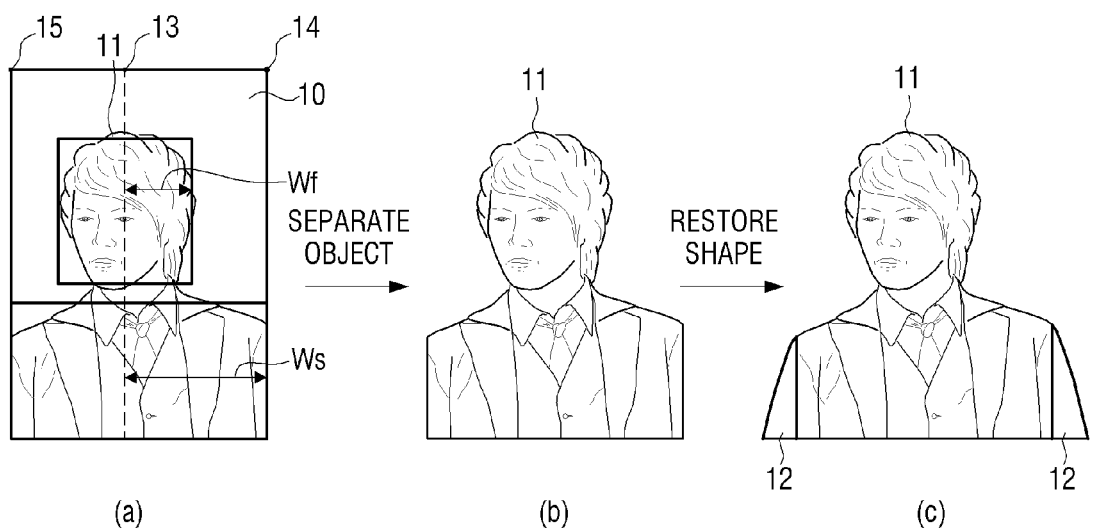
FIG. 7 illustrates a method for separating an object from a captured image and restoring a shape of the object.

FIG. 7 illustrates a method for restoring an object using a photographing device according to another exemplary embodiment of the present disclosure. With reference to FIG. 7, in the object 11, a width of a restoration area may be determined using widths of the face area and the body area. For example, as shown in FIG. 7(A), when a half of a width of the face area is represented as Wf and a half of a width of the body area is represented as Ws, a size of the restoration area may be determined using a log function.

More specifically, the controller 140 may determine the restoration area using the following expression.

[Expression 1]

$$Wf/Ws * 7 \log_2 |x| \qquad 1$$

A value calculated by Expression 1 may be used to determine the width of the restoration area. In Expression 1, x denotes a coordinate value on a horizontal axis. That is, modeling is performed on an x-y coordinate system in which a coordinate of a center point 13 of a top side of the first photographing image 10 in FIG. 7(A) is, for example, (0,0), an x coordinate increases in a direction from left to right, and a y coordinate increases in a downward direction. In this case, a part which forms a shape of a shoulder may be expressed by a coordinate (x,y). In FIG. 7, in order to restore the shoulder, a shape of the shoulder is determined first. In order to restore a right shoulder, the controller 140 calculates a y coordinate value using Expression 1, by sequentially increasing an x coordinate value from a point 14, which is a top right corner of the photographing image 10, to the right until the y coordinate value becomes a maximum value, i.e., a height of the first photographing image 10 in a vertical direction thereof. In order to restore a left shoulder, the controller 140 calculates the y value by sequentially decreasing the x value from a point 15, which is a top left corner of the first photographing image 10, to the left until the y value becomes the maximum value. As a result, when an area corresponding to the shoulders is determined, the image processor 120 draws a boundary line of shoulder portions 12 to be continuous from an edge line of the body area and provides an inner area of the drawn boundary line with a determined pixel value, so that the shoulder area may be restored. The pixel value of the restored area may be determined in a mirroring method which uses the same color of an adjacent pixel.

It should be noted that Expression 1 described above is given only for illustrative purposes and the disclosure is not limited thereto. Therefore, the controller 140 may also restore the shoulders using various mathematical function graphs. For example, instead of the log function, other functions which are similar to the log function may be used.

Consequently, as shown in FIGS. 7(B) and 7(C), the image processor 120 may separate the object 11 from the first photographing image and restore the shoulder portions 12. FIG. 7(C) shows the shape of the object 11 including the restored shoulder portions 12.

As described above, the photographing device 100 shoots a plurality of photographing images using the photographing unit 110 and generates a composite image. The number of photographing units may vary. For example, a plurality of photographing images may be obtained by performing a photographing operation multiple times using a single photographing unit or by sequentially or concurrently performing photographing operations using two or more photographing units. Hereinafter, a configuration and an operation of a photographing device including a plurality of photographing units according to an exemplary embodiment of the present disclosure are described.

Figure 8:
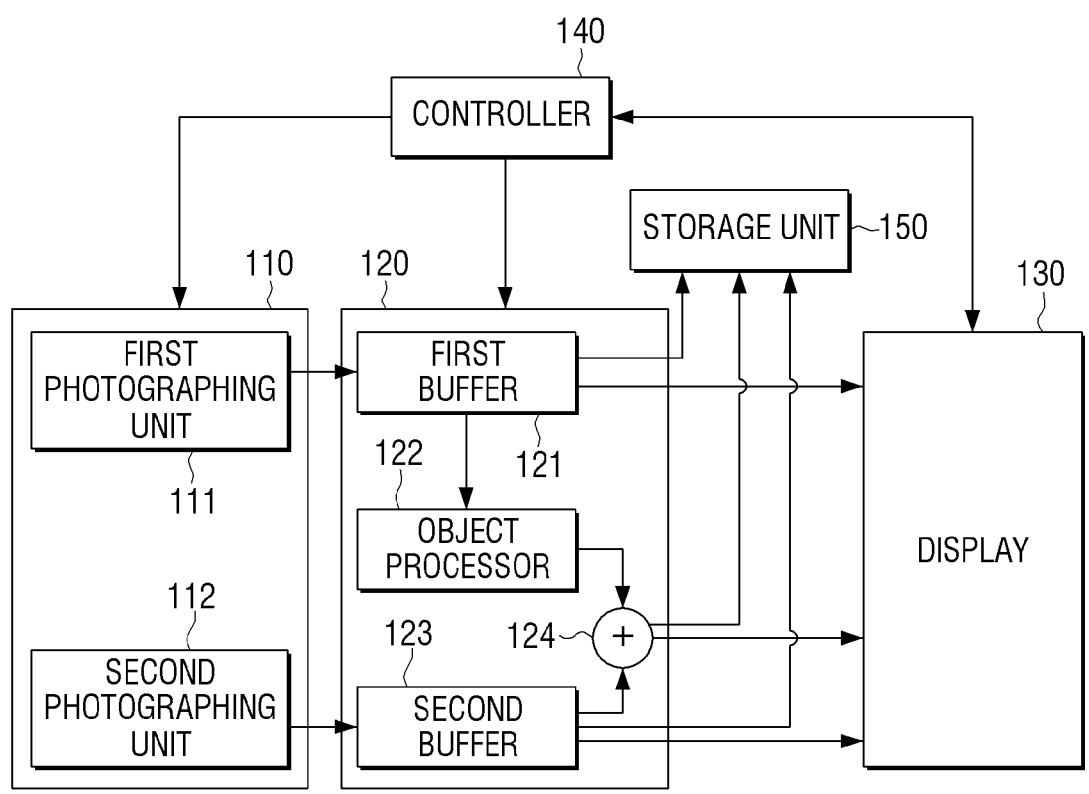
FIG. 8 is a block diagram illustrating a configuration of a photographing device according to an exemplary embodiment of the present disclosure.

FIG. 8 is a block diagram illustrating a configuration of a photographing device according to an exemplary embodiment of the present disclosure. With reference to FIG. 8, the photographing device 100 may include the photographing unit 110, the image processor 120, the display 130, the controller 140, and a storage unit 150.

The storage unit 150 may store various programs and data used in the photographing device 100. In addition, the storage unit 150 may store photographing images captured by the photographing unit 110 and composite images generated by the image processor 120. Furthermore, the storage unit 150 may store the object model as described above. The storage unit 150 may be a flash memory, hard disk drive (HDD), or the like which is built in the photographing device 100 or may be a memory card, a universal serial bus (USB) memory stick, a removable HDD, or the like which is mounted onto or is connectable to the photographing device.

The photographing unit 110 may include a plurality of photographing units such as a first photographing unit 111 and a second photographing unit 112. The first photographing unit 111 and the second photographing unit 112 may be provided in a main body of the photographing device 100 in opposite portions thereof. For example, when the first photographing unit 111 is provided on a first surface of the photographing device 100 to capture photographs in a first shooting direction, the second photographing unit 112 is provided on a second surface to capture photographs in a second shooting direction opposite to the first shooting direction.

When the composite shooting mode is entered, the controller 140 activates the first photographing unit 111 and displays a live view of the first photographing unit 111 on the screen of the display 130. Here, when a shooting command is input, the controller 140 controls the first photographing unit 111 to capture a photograph and obtains a first photographing image. The image processor 120 separates an image of an object from the first photographing image.

When the first photographing image is obtained by the first photographing unit 111, the controller 140 activates the second photographing unit 112. Accordingly, a live view acquired by the second photographing unit 112 on which the separated image of the object is superimposed, i.e. the background live view, is provided to the display 130.

The image processor 120 may include a first buffer 121, an object processor 122, a second buffer 123, and an adder 124. The first buffer 121 buffers image data sensed by the first photographing unit 111, and the second buffer 123 buffers image data sensed by the second photographing unit 112.

The object processor 122 separates data of an area which is determined to be an object from the image data stored in the first buffer 121. The separated data is transferred to the adder 124.

The adder 124 superimposes the object separated by the object processor 122 on an image buffered by the second buffer 123 and outputs the superimposed image to the display 130.

The display 130 may selectively display image data output from the first buffer 121, the second buffer 123, and the adder 124.

In a situation where a live view of the superimposed object and the background, i.e., the background live view, is displayed, when a shooting command is input, the controller 140 controls the second photographing unit 112 to capture a photograph and obtains a second photographing image. Subsequently, the controller 140 composites the first and second photographing images and stores the composite image in the storage unit 150.

Although it is described in this exemplary embodiment that the photographing unit 110 includes two photographing units, it should be noted that the number of photographing units may be varied depending on a particular application. In an alternative embodiment, the photographing unit 110 may include one photographing unit which can be rotated to photograph an image in different shooting directions. For example, the photographing unit 110 may capture the first photographing image in a first shooting direction and may be rotated by a predetermined angle to capture the second photographing image in a second shooting direction.

Also, in this exemplary embodiment, it is described that the display 130 displays image data provided from the image processor 120. However, it should be noted that the display 130 may also display image data received directly from the photographing unit 110.

Figure 9:
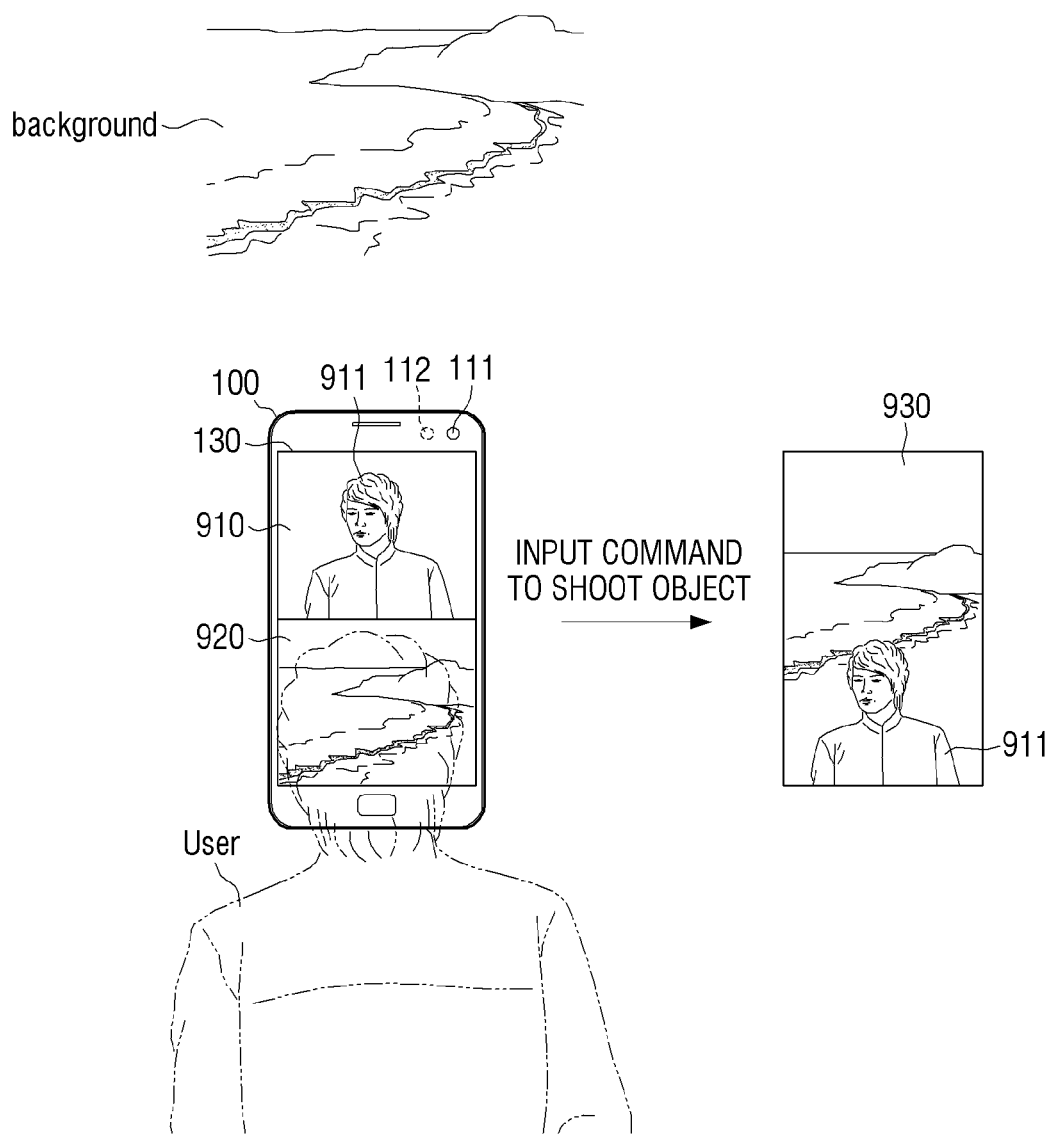
FIG. 9 illustrates an example of a method for producing a composite image.

FIG. 9 illustrates an example of a method for producing a composite image. With reference to FIG. 9, the display 130 is provided on a surface of the photographing device 100. The first photographing unit 111 is provided on the same surface on which the display 130 is provided, and the second photographing unit 112 is provided on a surface opposite to the display 130.

When performing a composite shooting, the first photographing unit 111 and the second photographing unit 112 may be sequentially activated as described above. However, FIG. 9 shows an exemplary embodiment in which the first photographing unit 111 and the second photographing unit 112 are simultaneously activated. In this case, the display 130 displays a live view 910 of the first photographing unit 111 and a live view 920 of the second photographing unit 112 together. Thus, while viewing the two live views 910 and 920 at the same time, the user may capture photographs.

For example, when the user inputs the shooting command, the controller 140 controls the first photographing unit 111 to take a photograph. The image processor 120 separates an object 911 from the photographed image. The screen is switched to a live view 930, in which the separated object 911 is displayed together on the screen. Here, when the user inputs the shooting command again, a composite image including the object 911 on the live view 930 is generated.

In another example, the user may select and photograph a background image first. That is, in a state where the two live views 910 and 920 are displayed, when the user touches the second live view 920, the background image is shot. In this case, the background image may be fixed in a portion of the screen in which the second live view 920 is displayed, and the first live view 910 may be continuously displayed. Alternatively, the background image may be displayed on an entire screen, and the first live view 910 may be displayed in a picture in picture (PIP) form or be transparently superimposed on the background image.

In another example, in a state where the two live views 910 and 920 are displayed, when the user inputs the shooting command, the controller 140 controls the first and second photographing unit 111 and 112 simultaneously to take photographs at the same time. Thus, when the background image and the object are obtained at the same time, the object is superimposed and displayed on the background image and the display position, the size, the shape, and other display properties of the object may vary according to the user's selection.

These various exemplary embodiments may be performed by various types of devices having a photographing function. When the photographing device 100 is a device which supports various applications such as a mobile phone and a table PC, the user may select a shooting mode before taking a photograph.

Figure 10:
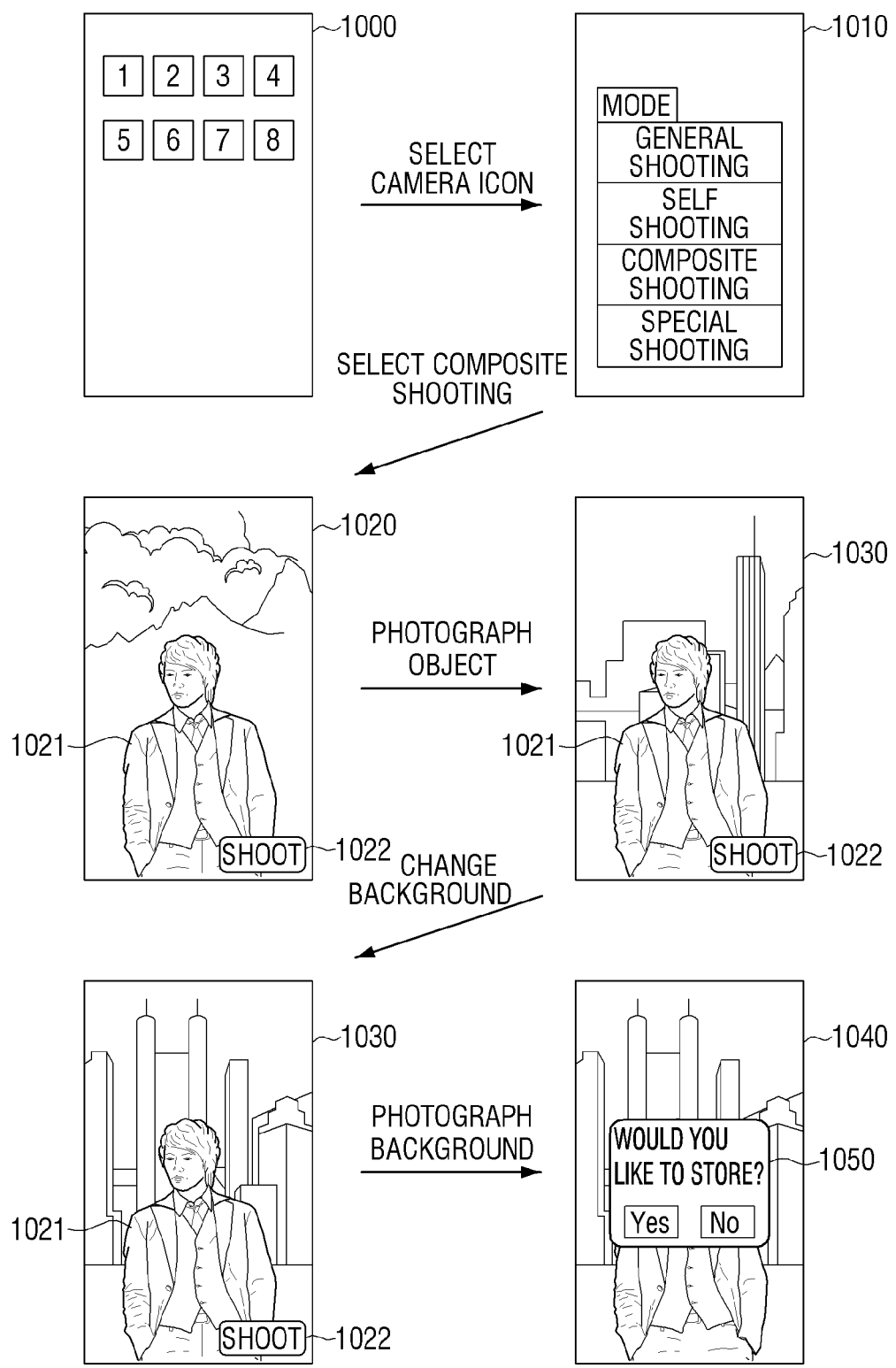
FIG. 10 illustrates a detailed example of a method for producing a composite image.

FIG. 10 illustrates a process of selecting a composite shooting mode and producing a composite image. With reference to FIG. 10, when the photographing device 100 is turned on or unlocked, an icon screen 1000 including icons for preset applications or folders may be displayed. Among the icons, the user may select a camera icon (not shown), i.e., an icon for a camera application.

When the camera icon is selected, the display 130 displays a selection screen 1010 for selecting various modes. The selection screen 1010 displays information about various modes such as a general shooting, a self shooting, a composite shooting, and a special shooting.

Here, when the composite shooting mode is selected, the first photographing unit 111 is activated first so that a live view 1020 of the first photographing unit 111 is displayed. On a screen of the live view 1020, a shooting menu 1022 may be displayed. When the user selects the shooting menu 1022, a first photographing image corresponding to the live view 1020 is generated and an object 1021 is separated from the first photographing image. Subsequently, the second photographing unit 112 is activated so that the object 1021 is superimposed on a live view of the second photographing unit 112 and displayed on a background live view 1030. The shooting menu 1022 may be displayed on the background live view 1030.

The user may rotate the photographing device 100 and select a background which the user wants. Accordingly, when the object 1021 is placed on the desired background live view 1030, the user may select the shooting menu 1022 so that a background image is photographed.

When the background image is photographed, the controller 140 displays a composite image 1040 including the object 1021 on the screen and also displays a question message 1050 for asking whether to store the composite image 1040. The controller 140 may store or may not store the composite image 1040 in the storage unit 150 according to the user's response to the question message 1050. When the composite image 1040 is not stored, the controller 140 returns to an operation of displaying the background live view 1030 including the object 1021.

Figure 11:
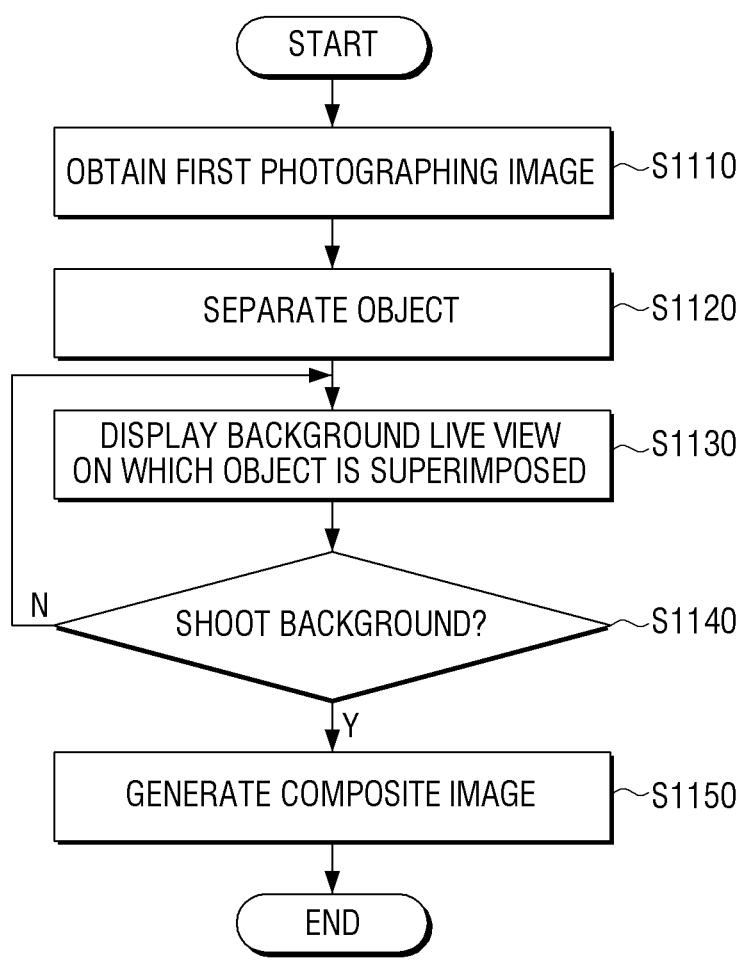
FIG. 11 is a flow chart illustrating a method for producing a composite image according to an exemplary embodiment of the present disclosure.

FIG. 11 is a flow chart illustrating a method for producing a composite image according to an exemplary embodiment of the present disclosure. With reference to FIG. 11, the photographing device 100 obtains a first photographing image in operation S1110 and separates an object from the first photographing image in operation S1120.

In operation S1130, the photographing device 100 displays the background live view on which the separated object is superimposed. The live views of the object and the background may be obtained by different photographing units or be obtained in sequence by a single photographing unit. Various display properties of the object such as the position, the size, the shape, the color and the brightness of the object may vary on the background live view according to the user's manipulation or display properties of the live view of the background. In addition, for the object, shape restoration may be performed and subsequent processing such as the tone mapping and the image matting may be performed.

When the shooting command is input in operation S1140, the photographing device 100 generates a photographing image corresponding to the background, composites the object and the photographing image, and generates a composite image in operation S1150.

Figure 12:
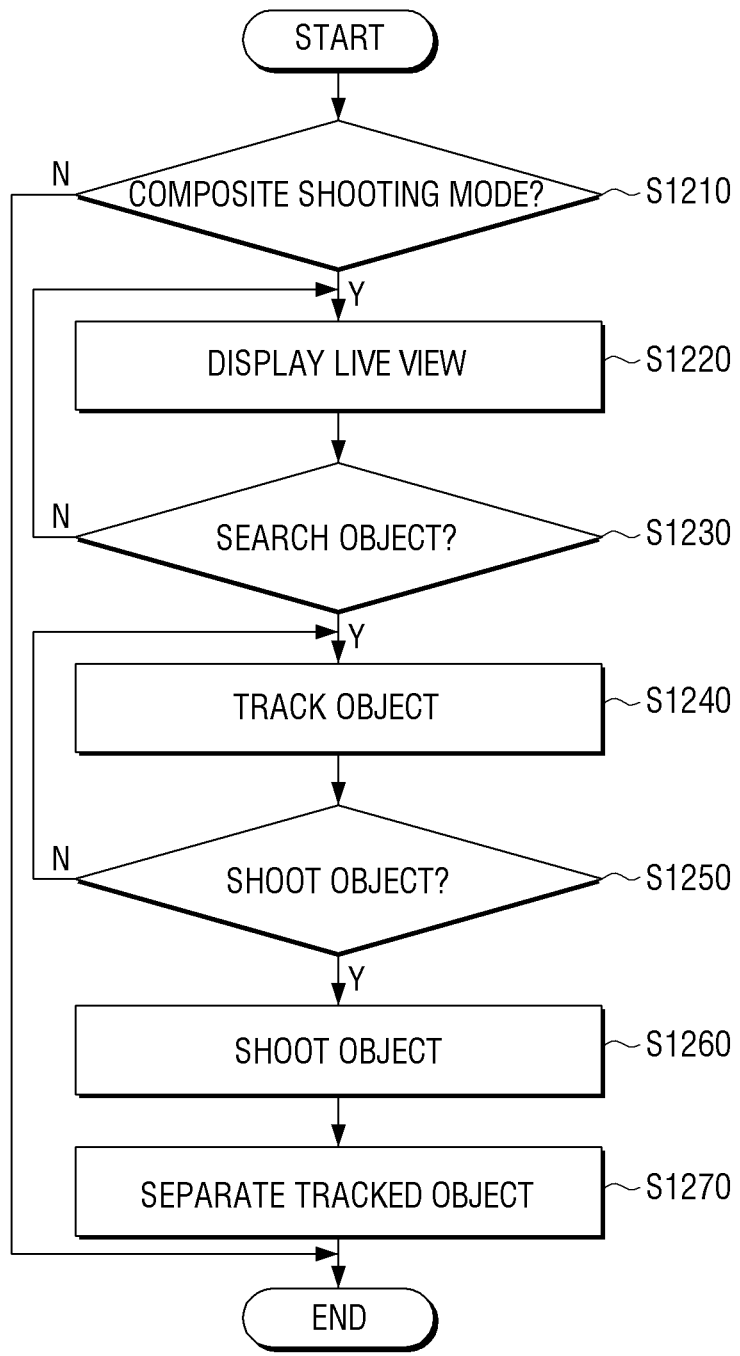
FIG. 12 is a flow chart illustrating a method for separating an object according to an exemplary embodiment of the present disclosure.

FIG. 12 is a flow chart illustrating a method for separating an object according to an exemplary embodiment of the present disclosure. With reference to FIG. 12, when the composite photographing mode is entered in operation S1210, a live view is displayed in operation S1220. In operation S1230, the photographing device 100 monitors respective frames of the live view and searches for an object. The object may be found using a previously learned object model. For example, the photographing device 100 may determine that an area corresponding to the object model on the photographing image corresponds to the object. When the object is determined and specified, the photographing device 100 tracks the object continuously in operation S1240.

Subsequently, when a command to take a photograph of the object is input in S1250, a first photographing image corresponding to the live view is taken in operation S1260, and the object is separated from the first photographing image in operation S1270. The separated object is superimposed on background live view so that the user may predict a composite image before photographing the background.

According to the various exemplary embodiments of the present disclosure, the user's image may be naturally composited with a background image. For example, since the position, the shape, and other display properties of the user's image may be conveniently adjusted on the background live view prior to photographing the background image, disadvantageous of the self shooting may be overcome.

The user may store the composite image in the photographing device 100 or upload the composite image to an external cloud server or web server so as to be shared with others.

In the exemplary embodiments as described above, the object is separated from the first photographing image and is superimposed on the live view of the background. However, the object may not be separated from a still image. For example, the object may be a dynamic object which is separated from each frame of moving image data or from a live view thereof.

More specifically, in the exemplary embodiment shown in FIG. 8, a first live view provided by the first photographing unit 111 may be buffered in the first buffer 121. The object processor 122 may perform an object separating operation on the live view buffered in the first buffer 121 for a preset period. Accordingly, according to a change to the first live view provided by the first photographing unit 111, the shape and the position of the separated object varies constantly. Such dynamic object may be superimposed on a second live view provided by the second photographing unit 112. Watching the second live view on which the dynamic object is superimposed, the user may input a shooting command at an appropriate time. When the shooting command is input, the controller 140 controls the first and second photographing unit 111 and 112 to perform shooting and adds the object separated from a first image shot by the first image photographing unit 111 to an image shot by the second photographing unit 112, thereby generating a composite image.

In addition, it may also be possible to separate an object from a moving image content provided by the storage unit 150 or an external storage medium and superimpose the object on another photographing image. Accordingly, the user may separate a desired object from previously shot moving image data and composite the object and the other photographing image, which is a newly shot image. Since the object separating method and the compositing method are the same as the exemplary embodiments described above, a description thereof will be omitted.

According to exemplary embodiments of the present disclosure, a separated image of an object is superimposed on a live view of a background to be provided to a user so that the user may obtain a composite image including the object and the background.

Thus, the user may easily take photographs of the user without other people's assistance.

The method for producing a composite image and method for separating an object according to the various exemplary embodiments described above may be coded as software and be stored in a non-transitory readable medium. The non-transitory readable medium may be built in various types of photographing devices and support the photographing devices to carry out the methods as described above.

A non-transitory readable medium is a medium which does not store data temporarily such as a register, cash, and memory but stores data semi-permanently and is readable by devices. More specifically, the aforementioned various applications or programs may be stored and provided in a non-transitory readable medium such as a compact disk (CD), digital video disk (DVD), hard disk, Blu-ray disk, universal serial bus (USB), memory card, and read-only memory (ROM).

The foregoing exemplary embodiments and advantages are merely exemplary and are not to be construed as limiting the present disclosure. The present teaching can be readily applied to other types of apparatuses. Also, the description of the exemplary embodiments of the present disclosure is intended to be illustrative, and not to limit the scope of the claims, and many alternatives, modifications, and variations will be apparent to those skilled in the art.

What is claimed is:
1. A photographing device comprising:
   a photographing unit;
   an image processor which separates an object from a first photographing image obtained by the photographing unit;
   a display which displays a background live view obtained by superimposing the separated object on a live view of a background; and
   a controller which obtains a second photographing image corresponding to the live view of the background when a command to shoot the background is input, and generates a composite image based on the separated object and the second photographing image,
   wherein the controller controls the image processor to restore a shape of the separated object by adding a restoration area of the object, the restoration area being not included in the first photographing image and not overlapping with an area of the separated object, and superimposes the separated object having the restored shape on the live view of the background.

2. The photographing device as claimed in claim 1, wherein, when a composite shooting mode is selected, the controller controls the display to display a live view of the object and searches for and tracks the object by monitoring respective frames of the live view of the object, and
   when a command to shoot the object is input, the controller generates the first photographing image corresponding to the live view of the object and controls the image processor to separate the tracked object from the first photographing image.

3. The photographing device as claimed in claim 2, wherein the photographing unit comprises:
   a first photographing unit which captures a photograph in a first shooting direction; and
   a second photographing unit which captures a photograph in a second shooting direction opposite to the first shooting direction, and
   when the composite shooting mode is entered, the controller activates the first photographing unit to provide the live view of the object to the display, and when the first photographing image is obtained by the first photographing unit, the controller activates the second photographing unit to provide the live view of the background, on which the separated object is superimposed and provided to the display.

4. The photographing device as claimed in claim 1, further comprising:
   a storage unit which stores a previously learned object model, the object model being obtained based on a plurality of images of the object to determine an object area in which the object is located,
   wherein the controller determines that the object is located in the object area determined by the object model on the first photographing image.

5. The photographing device as claimed in claim 4, wherein the display displays the first photographing image, and
   when a user's manipulation for the first photographing image is performed, the controller changes at least one of a size and a shape of the object area according to the user's manipulation.

6. The photographing device as claimed in claim 1, wherein the controller determines the restoration area based on widths of a face area and a body area of the separated object.

7. The photographing device as claimed in claim 1, wherein the controller controls the image processor to adjust at least one of a display position, a size, a color and a brightness of the object on the background live view according to a user's selection.

8. The photographing device as claimed in claim 1, wherein the controller adjusts at least one of a display position, a size, a color and a brightness of the separated object based on the live view of the background.

9. A method for producing a composite image, the method comprising:
    obtaining a first photographing image and separating an object from the first photographing image;
    restoring a shape of the separated object by adding a restoration area of the object, the restoration area being not included in the first photographing image and not overlapping with an area of the separated object;
    displaying a background live view obtained by superimposing the separated object having the restored shape on a live view of a background;
    obtaining a second photographing image corresponding to the live view of the background when a command to shoot a background is input; and
    generating a composite image based on the separated object and the second photographing image.

10. The method as claimed in claim 9, wherein the separating the object comprises:
    when a composite shooting mode is selected, displaying a live view of the object;
    searching for and tracking the object by monitoring respective frames of the live view of the object, and
    when a command to shoot the object is input, generating the first photographing image corresponding to the live view of the object; and
    separating the tracked object from the first photographing image.

11. The method as claimed in claim 10, wherein the searching for and tracking the object comprises:
    obtaining an object model based on a plurality of images of the object to determine an object area in which the object is located; and
    determining that the object is located in the object area determined by the object model on the first photographing image.

12. The method as claimed in claim 11, wherein the separating the object comprises:
    displaying the first photographing image; and
    when a user's manipulation for the first photographing image is performed, changing at least one of a size and a shape of the object area according to the user's manipulation.

13. The method as claimed in claim 9, wherein the restoring the shape of the separated object comprises determining the restoration area based on widths of a face area and a body area of the separated object.

14. The method as claimed in claim 9, further comprising:
    adjusting at least one of a display position, a size, a color and a brightness of the separated object on the background live view according to a user's selection.

15. The method as claimed in claim 9, further comprising:
    adjusting at least one of a display position, a size, a color and a brightness of the separated object based on the live view of the background.

16. An image processing apparatus comprising:
    a first image input unit which receives a first image including an object;
    a second image input unit which receives a second image different from the first image;
    an object processing unit which separates the object from the first image; and
    an image composing unit which superimposes the separated object on the second image to be provided as a preview image to a user and generates a composite image based on the separated object and the second image when the preview image is selected by the user,
    wherein the object processing unit restores a shape of the separated object by adding a restoration area of the object, the restoration area being not included in the first image and not overlapping with an area of the separated object, and the image composing unit generates the composite image based on the object having the restored shape and the second image.

17. The image processing apparatus as claimed in claim 16, wherein the first image and the second image are received simultaneously.

18. The image processing apparatus as claimed in claim 16, wherein the first image and the second image are received in a subsequent order.

19. The image processing apparatus as claimed in claim 16, wherein the object processing unit determines the restoration area of the object based on widths of a face area and a body area of the separated object.

20. The image processing apparatus as claimed in claim 16, wherein the object processing unit adjusts at least one of a display position, a size, a color and a brightness of the object on the preview image according to a user's selection.

21. The image processing apparatus as claimed in claim 16, wherein the controller adjusts at least one of a display position, a size, a color and a brightness of the separated object based on the second image.

22. A non-transitory computer readable recording medium having recorded thereon a program executable by a computer for performing the method of claim 9.

* * * * *